United States Patent [19]
Yoshida et al.

[11] Patent Number: 5,637,443
[45] Date of Patent: Jun. 10, 1997

[54] PROCESS FOR PRODUCING PATTERNED RESIN FILMS WHICH INCLUDES PRETREATMENT WITH WATER SOLUBLE SALT AQUEOUS SOLUTION PRIOR TO FILM DEVELOPMENT

[75] Inventors: Yasuhiro Yoshida; Shigeru Kubota, both of Amagasaki; Akihiko Yamaguchi; Kenichiro Ishibashi, both of Sagamihara, all of Japan

[73] Assignee: Mitsubishi Denki Kabushiki Kaisha, Chiyoda, Japan

[21] Appl. No.: 267,202

[22] Filed: Jul. 5, 1994

[30] Foreign Application Priority Data

Jul. 23, 1993 [JP] Japan .................... 5-182687

[51] Int. Cl.$^6$ .................... G03C 5/00; B08B 3/12; B08B 3/00; B08B 6/00
[52] U.S. Cl. .................... 430/325; 430/326; 430/331; 134/1; 134/27; 134/28; 134/902
[58] Field of Search .................... 430/331, 325, 430/326; 134/1, 27, 28, 902

[56] References Cited

U.S. PATENT DOCUMENTS

| | | | |
|---|---|---|---|
| 4,379,830 | 4/1983 | Deutsch et al. | 430/331 X |
| 4,400,460 | 8/1983 | Fickes et al. | 430/331 X |
| 4,400,461 | 8/1983 | Chandross et al. | 430/270 X |
| 4,786,582 | 11/1988 | Duyal | 430/331 |
| 4,801,521 | 1/1989 | Ohki et al. | 430/386 X |
| 4,983,252 | 1/1991 | Masui et al. | 156/630 |
| 5,002,857 | 3/1991 | Toyama et al. | 430/331 X |
| 5,272,044 | 12/1993 | Nishigaki et al. | 430/393 |
| 5,296,339 | 3/1994 | Fujita et al. | 430/389 |

FOREIGN PATENT DOCUMENTS

| | | | |
|---|---|---|---|
| 2-143254 | 6/1990 | Japan . | |
| 4-303990 | 10/1992 | Japan . | |
| 4338960 | 11/1992 | Japan | 430/326 |

OTHER PUBLICATIONS

English Translation of JP-4-338960 Kurihara et al.
JP 63-229,452 English Translation, Hashimoto Mar. 1987.
IBM Tech. Disc. Bulletin, vol. 15, No. 11, Apr., 1973 Arcus et al.

*Primary Examiner*—George F. Lesmes
*Assistant Examiner*—Bernard P. Codd
*Attorney, Agent, or Firm*—Burns, Doane, Swecker & Mathis, LLP

[57] ABSTRACT

An uncomplicated and easy to control process for forming patterns, wherein an active beam sensitive resin is exposed to an active beam such that a correctly formed pattern is produced on the resin. The process comprises the steps of forming a film of an active beam sensitive resin on a substrate, exposing the film to an active beam, and developing the exposed film with a developing solution comprising a weakly basic salt in a basic aqueous solution having a hydrogen ion concentration sufficient to finish the developing within a desired period of time and an ionic strength sufficient to prevent a substantial decrease in the thickness of the exposed film.

10 Claims, No Drawings

PROCESS FOR PRODUCING PATTERNED RESIN FILMS WHICH INCLUDES PRETREATMENT WITH WATER SOLUBLE SALT AQUEOUS SOLUTION PRIOR TO FILM DEVELOPMENT

BACKGROUND OF THE INVENTION

The present invention relates to a process for highly accurate pattern formation by using an active beam sensitive resin.

Pattern formation by using an active beam sensitive resin is carried out by coating various substrates with the resin to form a resin film, subjecting the film to pattern exposure with an active beam such as light, electron beam or X-ray, and then developing with a developing solution for dissolving the film only at unnecessary parts thereof.

Prior processes for forming patterns are conducted by exposing the active beam sensitive resin to cause reaction of the resin or sensitive groups therein, resulting in a change of solubility of the resin to the developing solution. The simplest mechanism of such solubility change is based on an increase in molecular weight or on formation of a network structure by intermolecular crosslinking reaction of the resin. However, a process in which only the crosslinking reaction is employed is not suitably applied to accurate patterning, since a sufficient solubility change cannot be obtained solely by the crosslinking reaction, and thus the crosslinked resin parts may swell with a developing solution. Therefore, for the purpose of highly accurate patterning, a mechanism is employed whereby polarity of the resin is varied by the reaction of sensitive groups to change the solubility of the resin to the developing solution. Change polarity of the resin itself varies its affinity for the developing solution and can decrease the swelling of the resin during the development. Thus highly accurate patterning is possible, and formation of a positive pattern can be achieved, which could not be realized by the crosslinking reaction. At present, studies are actively proceeding on high quality pattern formation using the above mechanism. These studies are classified into two area; one is to enhance characteristics of materials of the resin itself, and another is to improve processes for forming patterns. As to the latter area there are some proposals under study to modify a coated film of an active beam sensitive resin.

Regarding an active beam sensitive resin, many sensitive groups can cause change in its polarity. However, sensitive groups which can bring about polarity change which causes a solubility change that is large enough with respect to the developing solution are very limited. Since this solubility change to the developing solution determines the form of patterns finally formed, in the prior pattern formation process insufficient solubility change made it very difficult to form good patterns correctly corresponding to a pattern mask. Even if a large enough change in solubility is attained, there are extreme restrictions in practical use; difficult process control because of very strict developing conditions, and a higher cost of the resin due to the large amount of sensitive groups required.

On the contrary, with respect to improvement in pattern forming processes, there is an effective method to enhance quality the pattern in which a decrease in film thickness of the pattern during development is restrained, which thereby improves contrast of the obtained pattern and its dimensional accuracy. As examples of this process, the following methods have been propsosed a resist for semi-conductors, in which an alkalizing treatment is adopted on the resist film before exposing (Semicon News 1988 Sept., p. 90–101), and a method in which a metal complex layer is formed on an organic resist film before exposing (JP-A-143254/1990). However, those methods are not suitable for practical use, because they need additional processes and strict conditions for obtaining the desired effect.

The present inventors have found as a result of various studies that by incorporating a certain ion in an aqueous solution, solubility of a resin can be lowered. As a concrete behavioral change of the dissolution inhibition effect of lowering the solubility of the pattern, the resin becomes difficult to dissolve in a developing solution. Furthermore if an ion content is increased, the resin itself can be modified and becomes difficult to dissolve even in an aqueous solution having a small mount of ions in subsequent steps. Though the cause of that effect is not clear, it supposedly is affected largely by the change in activity of the aqueous solution containing ions. Also the effect will relate to formation of chelate compounds. The degree of the effect remarkably depends on the kind and concentration of ions, and further, is largely affected by characteristics of the resin itself. Thus, it has been found that when using this effect for forming patterns of polarity changeable type active beam sensitive resins, solubility of the resin of the pattern parts can be reduced to inhibit the decrease in film thickness at patterns during developing and the quality of the obtained pattern can be enhanced.

The present invention is intended to solve the aforementioned problems, and its object is to provide a patterning process by which the reaction of the resin by an active beam radiation correctly corresponds to the formed pattern, and by which the process steps are not complicated and are easily controlled.

SUMMARY OF THE INVENTION

According to the present invention, there is provided an improved process for forming patterns comprising a step for forming a film of an active beam sensitive resin on a substrate, a step for exposing the film to an active beam and a step for developing the exposed film with a developing solution; the improvement which comprises employing, as the developing solution, a solution prepared by dissolving a weakly basic salt in a basic aqueous solution having a hydrogen concentration sufficient to finish the developing within the desired period of time, whereby ionic strength is increased at least 1.5 times (this is referred to as the "first invention").

According to the present invention, there can also be provided the process in the first invention wherein the developing solution is an aqueous solution having a buffer effect and which is prepared by increasing a concentration of the weakly basic salt of the aqueous solution while maintaining a hydrogen ion concentration sufficient to finish the developing within the desired period of time (this is referred to the "second invention").

According to the present invention, there can be provided the process in the first invention wherein the developing solution is an aqueous solution prepared by admixing a neutral salt with a basic aqueous solution to adjust ionic strength and a hydrogen ion concentration (this invention is referred to as "third invention").

According to the present invention, there can be provided the process in the first invention wherein the developing step is divided into two steps in which ionic strength decreases step by step (this is referred to as the "fourth invention").

According to the present invention, there can be provided a process for forming patterns, which comprises the sequential steps; a step for forming a film of an active beam sensitive resin on a substrate, a step for exposing the film to an active beam, and a step for developing the film with a basic aqueous solution after bringing the film into contact with an aqueous solution containing a water-soluble salt (this is referred to as the "fifth invention").

According to the present invention, there can further provide the following processes.

The sixth invention relates to the process of the first or fifth invention, which further comprises, after the developing step, a step for exposure to a solution having a high ionic strength.

The seventh invention relates to the process of the first or fifth invention, which further comprises, after the developing step, a step for drying and a step for washing with water.

The eighth invention relates to the process of the first or fifth invention, which comprises, after the developing step, a step for impregnating the patterned film with a non-polar solvent.

The ninth invention relates to the process of the first or fifth invention, which further comprises, after the developing step, a step for washing with an aqueous solution containing an ion prepared by dissolving a salt.

The tenth invention relates to the process of the first or fifth invention, which further comprises, after the developing step, a step for washing with an acidic aqueous solution having a hydrogen ion concentration of not more than pH 6.0, desirably not more than pH 3.0.

The eleventh invention relates to the process of the first or fifth invention, which further comprises, after the developing step, a step for washing with an aqueous solution prepared by adding an oxidizing agent to ion an acidic aqueous solution having a hydrogen concentration of not more than pH 6.0, desirably not more than pH 3.0.

DETAILED DESCRIPTION

The first invention of the present inventions, is characterized in that, as the developing solution, there is used a solution prepared by dissolving a weakly basic salt in a basic aqueous solution having a hydrogen ion concentration sufficient to finish the developing within the desired period of time, whereby ionic strength is increased at least 1.5 times. According to the first invention, since the addition ions are contained in the developing solution, the resin can be prevented from dissolution during the developing. This dissolution inhibition effect, particularly in the surface area of the resin, can improve the quality of the patterns.

The second invention is characterized in that, as the developing solution, there is used an aqueous solution having a buffer effect, which is prepared by increasing the concentration of a weakly basic salt of the aqueous solution while maintaining a hydrogen ion concentration sufficient to finish the developing within the desired period of time. Such a developing solution may be prepared by admixing aqueous solutions of two or more chemical compounds. An ionic strength and a hydrogen ion concentration can be optionally determined by varying the mixing ratio and the concentration of the aqueous solutions. Accordingly, when the aqueous solution is used as the developing solution, the dissolution inhibition effect of the resin can be effectively obtained, and the thickness of the resulting patterns can be prevented from decreasing during the developing. Further, since the hydrogen ion concentration in the developing solution is stable due to the buffer effect, it is advantageous that time variation of the developing can be reduced, which can make the process stable.

The third invention is characterized in that, as the developing solution, there is used an aqueous solution prepared by admixing a neutral salt with a basic aqueous solution to adjust ionic strength and hydrogen ion concentration. According to the third invention, the ionic strength of the developing solution can be varied by adding salt to control the dissolution inhibition effect due to the produced ions. Also, the hydrogen ion concentration can be varied by introducing a base to control the rate of developing.

The fourth invention is characterized in that the developing step is divided into two or more steps in which ionic strength decreases step by step. According to the fourth invention, the first developing solution having a high ionic strength can sufficiently inhibit the dissolution of the resin at the patterned part, and the second developing solution having a lower ionic strength can remove the residual resin at the part to be dissolved.

The fifth invention is characterized in that, after the active beam exposing step and before the developing step, the active beam exposed film is exposed to an aqueous solution containing a water-soluble salt. According to the fifth invention, since before the resin is in developing step the active beam exposed contact with the solution containing the ions, the insoluble resin of the exposed part or the non-exposed part is reduced in solubility to the developing solution, which can improve the quality of the resulting patterns. Though the contact with the ion-containing solution also tends to reduce the solubility of the soluble part, the reduction of the solubility is smaller than that of the insoluble part. Further, the reduction of the solubility of the soluble part does not cause difficulty, because such reduction occurs only in the surface area and the solubility of the inner part of the resin is not reduced.

The sixth invention is characterized in that, after the developing step, the developed pattern is exposed to the solution having a high ionic strength. The sixth invention is based on the idea that further dissolution inhibition of the developed pattern can be obtained by bringing it into contact with the solution having a high ionic strength. As a result, the developed pattern can be made more resistant against subsequent processes such as a step for washing with water.

The seventh invention is characterized in that, after the developing step, the developed pattern is subjected to a step for drying and thereafter a step for washing with water. The drying can concentrate the ions which are present on the surface of and in the resin to enhance the dissolution inhibition effect, which makes the pattern tough against subsequent processes such as a step for washing with water.

The eighth invention is characterized in that, after the developing step, the developed pattern is impregnated with a non-polar solvent. The impregnation with non-polar solvent makes the hydrophilic property of the patterned resin lower, which results in enhancing the resistance against subsequent processes such as a step for washing with water. In addition, since the brittleness of the pattern can be reduced, it becomes difficult to incur damage, such as peeling off, when applying a physical shock to the pattern.

The ninth invention is characterized in that, after the developing step, the developed pattern is washed with an aqueous solution containing an ion prepared by dissolving a salt. The developed pattern has the dissolution inhibition effect due to the use of the developing solution containing the water-soluble salt. According to the ninth invention, the developed pattern is washed with the ion-containing water which is endowed with the dissolution inhibition effect due to the ion. As a result, the developed pattern can be effectively washed without incurring damage. Namely, the pattern can be protected by adding a small amount of the salt.

The tenth invention is characterized in that, after the developing step, the developed pattern is washed with an acidic aqueous solution having a hydrogen ion concentration of not more than pH 6.0, desirably not more than pH 3.0, whereby the dissolution of the developed pattern can be inhibited during the washing. Generally, active beam sensitive resins for an alkaline solution developing method are themselves acidic, and are soluble in only an aqueous solution having a lower hydrogen ion concentration to some extent. Therefore, the use of an acidic washing water is effective to inhibit the unnecessary dissolution of the pattern.

The eleventh invention is characterized in that the washing water of the tenth invention contains an oxidizing agent. The oxidizing agent may oxidize and decompose fine dusts on a substrate or fine projections of the pattern surface. Since those dusts and projections have a relatively large surface area, the decomposition is selective.

The present invention relates to a process for forming patterns having good form, and can provide a developing solution and rinsing solution, which are suitable for such pattern formation. Therefore any methods for coating resist on a substrate and for exposing may be employed. For examples of the resist coating methods, there can be employed such methods as coating of a liquid resist with a roll coater or the like, spin coating with a spinner, screen printing, electro-deposition coating, and heat pressing of a dry resist film. Also there can be used various exposing methods by using ultraviolet rays from a mercury lamp and a halogen lamp, far ultraviolet radiation lamp light, excimer laser light, electron beam, X-ray and the like, as light sources for exposing.

The present invention is specifically and concretely explained hereinbelow by means of Examples. However, the present invention is not limited to the Examples.

EXAMPLES 1 TO 2 AND COMPARATIVE EXAMPLES 1 TO 2

These Examples were conducted for the first invention. The aqueous basic solution used in the first invention is not particularly limited, and examples thereof are, for instance, aqueous solutions of strong bases such as sodium hydroxide, potassium hydroxide and tetramethylammonium hydroxylate, and also aqueous solutions of weak bases such as alkali metal salts and alkaline earth metal salts of carbonic acid, silicic acid, acetic acid, phosphoric acid, boric acid or the like. The weak base salts are, for example, alkali metal salts and alkaline earth metal salts of carbonic acid, silicic acid, acetic acid, phosphoric acid or boric acid.

Examples 1 and 2 were carried out according to the following procedures. First, an active beam sensitive resin of a methyl cellosolve acetate solution of cresol novolak resin containing 10% by weight of a naphthoquinone diazide derivative was coated on a silicon wafer in a film thickness of about 9 μm by a spin coating. Then a pattern mask was brought into close contacted with the coated film, followed by exposing to irradiation from a high pressure mercury lamp. The developing was carried out by using the developing solutions with the given ionic strength under the developing conditions as shown in Table 1. The Comparative Example 1 and 2 were carried out in the same manner as above excepting the use of the developing soultion having such an ionic strength that can provide a developing speed similar to that of normal cases. As compared to the results of Comparative Examples, those of Example 1 and 2 indicate that there is no decrease in the coated film thickness of the developed pattern and that good pattern can be obtained.

TABLE 1

| | Developing solution | | Developing | Form of pattern (Decrease in |
|---|---|---|---|---|
| | Kind | Ionic strength | method (Dipping) | coated film thickness) |
| Example 1 | Na$_2$CO$_3$ | 0.32 | 30° C., 60 seconds | Good (0%) |
| Comparative Example 1 | Na$_2$CO$_3$ | 0.14 | 30° C., 60 seconds | Rough surface (25%) |
| Example 2 | NaOH Na$_2$CO$_3$ | 0.3 | 30° C., 60 seconds | Good (0%) |
| Comparative Example 2 | NaOH | 0.003 | 30° C., 60 seconds | Rough surface (40%) |

The ionic strengths of Examples 1 and 2 are 0.32 and 0.3 respectively, and as compared to 0.14 and 0.003 in normal cases shown in Comparative Examples 1 and 2, they are abut 2.3 times and 100 times respectively. As a result of the studies as to how much ionic strength should be increased as compared to normal cases, too small increase is ineffective and the increase by not less than 1.5 times is proper.

EXAMPLE 3 AND COMPARATIVE EXAMPLE 3

This Example illustrates the second invention. The developing solutions used in the second invention are, for example, a mixed aqueous solution of sodium carbonate and sodium hydrogen carbonate, a mixed aqueous solution of ammonium and ammonium chloride, a mixed aqueous solution of disodium hydrogen phosphate and sodium hydroxide, a mixed aqueous solution of boric acid and sodium hydroxide, a mixed aqueous solution of sodium hydroxide and potassium chloride, a mixed aqueous solution of glycine, sodium chloride and sodium hydroxide, a mixed aqueous solution of sodium tetraborate and sodium carbonate, a mixed aqueous solution of hydrochloric acid and sodium carbonate, a mixed aqueous solution of boric acid, potassium chloride and sodium carbonate, an aqueous solution of sodium silicate, and the like.

Example 3 was carried out according to the same coating and exposing procedures as in Examples 1 and 2. Subsequently, the developing was carried out with the developing solution having a buffer effect and an increased concentration of the basic salts under the developing conditions shown in Table 2.

Comparative Example 3 shown in Table 2 indicates the results obtained by using normal developing conditions in which a developing solution has a buffer effect and a weakly basic salt concentration capable of normal rate of developing. As compared to the results of Comparative Example 3, according to the results of Example 3, no decrease in the film thickness is found and good patterning can be performed.

TABLE 2

| | Developing solution | | | | Form of pattern |
|---|---|---|---|---|---|
| | Kind | Concentration (% by weight) | pH | Developing method (Dipping) | (Decrease in coated film thickness) |
| Example 3 | NaHCO$_3$ Na$_2$CO$_3$ | 0.93 3.83 | 10.6 | 35° C., 90 seconds | Good (0%) |
| Comparative Example 3 | NaHCO$_3$ Na$_2$CO$_3$ | 0.63 1.75 | 10.6 | 35° C., 90 seconds | Rough surface (30%) |

EXAMPLE 4 AND COMPARATIVE EXAMPLE 4

This Example illustrates the third invention. The aqueous basic solutions used in the third invention are not particularly limited, and examples thereof are, for instance, aqueous solutions of strong bases such as sodium hydroxide, potassium hydroxide and tetramethylammonium hydroxylate, and aqueous solutions of weak bases such as alkali metal salts and alkaline earth metal salts of carbonic acid, silicic acid, acetic acid, phosphoric acid or boric acid. When other metals than alkali metals and alkaline earth metals are used, there is a case where a certain residue is easily formed after developing. The neutral salts used in the third invention are not particularly limited, and desirable are those of strong acid alkali metals, alkaline earth metals, or the like.

When a developing solution prepared by mixing sodium chloride with an aqueous sodium hydroxide solution shown in Table 3 is used, it can be found that decrease in film thickness of patterns is largely inhibited as compared to the case using an aqueous sodium hydroxide solution alone shown in Comparative Example.

TABLE 3

| | Developing solution | | | Form of pattern |
|---|---|---|---|---|
| | Kind | Concentration (% by weight) | Developing method (Dipping) | (Decrease in coated film thickness) |
| Example 4 | NaOH NaCl | 0.1 2.0 | 30° C., 90 seconds | Good (0%) |
| Comparative Example 4 | NaOH | 0.1 | 30° C., 90 seconds | Large decrease (50%) |

EXAMPLE 5 TO 6 AND COMPARATIVE EXAMPLE 5 TO 6

These Examples illustrate the fourth invention. Table 4 indicates the results of developing performed by dividing a developing solution tank into two sections with the ionic strength of the second section being lower than that of the first section. The results demonstrate that in case of Comparative Examples 5 and 6 without the second developing, the presence of residues are partly found after developing, and that in Examples of the forth invention, no residue is found and a good pattern can be formed.

TABLE 4

| | First Developing Section | | Second Developing Section | | Developing conditions (°C., seconds) | Form of pattern (Decrease in coated film thickness %) |
|---|---|---|---|---|---|---|
| | Kind | Ionic strength | Kind | Ionic strength | | |
| Example 5 | Na$_2$CO$_3$ | 0.4 | Na$_2$CO$_3$ | 0.1 | 30° C., 30 seconds each | Good 5 |
| Comparative Example 5 | Na$_2$CO$_3$ | 0.4 | — | — | 30° C., 60 seconds | Residues found 0 |
| Example 6 | NaOH NaCl | 0.5 | NaOH NaCl | 0.1 | 30° C., 30 seconds each | Good 3 |
| Comparative Example 6 | NaOH NaCl | 0.5 | — | — | 30° C., 60 seconds | Residues found 0 |

EXAMPLE 7 TO 9 AND COMPARATIVE EXAMPLE 7

These Examples illustrate the fifth invention. The soluble salts-containing aqueous solutions which can be used in the fifth invention, are aqueous solutions containing not less than 3.0% by weight, desirably not less than 5.0% by weight of alkali metal salts or aqueous solutions containing 0.1 to 20% by weight, desirably 1.0 to 10% by weight of other metal salts than alkali metal salts.

When the concentration is below aforementioned range, sufficient dissolution inhibition effect cannot be obtained. When the concentration of other metal salts than alkali metal salts is higher than the above range, it is not desirable, because the effect is too large and the developing cannot be performed. For the developing solution in the above case, the resin dissolution inhibition effect due to the contained ions is not necessary, and usual aqueous alkaline solutions can be used. As alkali metals, Na, K and Li can be used. Non-restricted desirable metals other than alkali metals are Mg, Ca, Fe, Cu, Zn, Al, Si and Mg. Also Ag, Cr, Sn and V can be used, but are disadvantageous from cost and toxicity points of view.

Experiments (Examples 7 to 9 and Comparative Example 7) of the fifth invention were carried out in the same manner as in Example 1, except that the conditions shown in Table 5 were employed. It is obvious from Table 5, that decrease in film thickness of the patterns by developing can be reduced by subjecting the film to potassium chloride-containing aqueous solution or sodium chloride-containing aqueous solution prior to the developing.

drying is enough that water remained in the resin after developing is evaporated, and no heating is necessary.

As concretely shown in Table 6, experiment was conducted, after the developing by drying at 40° C. for five minutes, and then rinsing by means of dipping method with

TABLE 5

|  | Pre-treatment for developing (% by weight, seconds) | Developing solution (% by weight) | Developing conditions (°C., seconds) | Form of pattern (Decrease in coated film thickness %) |
| --- | --- | --- | --- | --- |
| Example 7 | $CaCl_2$ 1.0, 20 | NaOH; 0.5 | Dipping method 30, 80 | Small decrease 10 |
| Example 8 | NaCl 3.0, 20 | NaOH; 0.5 | Dipping method 30, 80 | Good 6 |
| Example 9 | NaCl 5.0, 20 | NaOH; 0.5 | Dipping method 30, 80 | Good 3 |
| Comparative Example 7 | — | NaOH; 0.5 | Dipping method 30, 50 | Large decrease 50 |

EXAMPLES 10 TO 12

These Examples illustrate the sixth invention. In the sixth invention, there can be used aqueous solutions containing desirably not less than 2.0% by weight, more desirably not less than 10.0% by weight of alkali metal salts or aqueous solutions containing desirably not less than 0.1% weight, more desirably not less than 1.0% by weight of other metal salts than alkali metal salts. When the concentration is below the above range, a sufficient dissolution inhibition effect cannot be obtained and enough curing of patterns cannot be achieved. As the alkali metals, Na, K, and Li can be used. Non-restricted desirable other metals than alkali metals are Mg, Ca, Fe, Cu, Zn, Al, Si and Mg. Also Ag, Cr, Sn, V, or the like is usable, but are disadvantageous from cost and toxicity points of view.

As concretely shown in Table 6, experiments were carried out, after the developing, by bringing the developed film into contact with a solution containing potassium chlorides and magnesium sulfate and having larger ionic strength, and then deionized water. The good pattern free from decrease in film thickness could also be obtained in this Example 13.

EXAMPLES 14 AND 15

These Examples illustrate the eighth invention. In the eighth invention, any non-polar solvent which does not dissolve an active beam sensitive resin forming patterns can be used. Examples are toluene, xylene, decalin, ethyl benzyl ether, n-hexanol, or the like. Desirable non-polar solvents have a boiling point of not less than 60° C., particularly not less than 80° C. Too low boiling point causes problems that the solvent is easily evaporated and that the strength of cured resin is not kept for the required period of time.

As concretely shown in Table 6, experiments were carried out, after developing, by subjecting to toluene and cyclohexane contact for each five seconds, and then rinsing by means of dipping method with deionized water. In both of Examples 14 and 15, good patterns free from a decrease in film thickness could be obtained.

TABLE 6

|  | Developing solution (% by weight) | Developing conditions (°C., seconds) | Post-treatment after developing (% by weight, seconds) | Rinsing conditions (°C., seconds) | Form of pattern (Decrease in coated film thickness %) |
| --- | --- | --- | --- | --- | --- |
| Example 10 | $Na_2CO_3$; 2 $NaHCO_3$; 1 | Dipping method 34, 100 | $CaCl_2$ 3, 10 | Dip-rinsing 24, 60 | Good 0 |
| Example 11 | $Na_2CO_3$; 2 $NaHCO_3$; 1 | Dipping method 34, 100 | $MgSO_4$ 1, 10 | Dip-rinsing 20, 60 | Good 0 |
| Example 12 | $NH_4Cl$; 0.7 $NH_3$; 2.2 | Dipping method 30, 150 | $MgSO_4$ 5, 10 | Dip-rinsing 24, 60 | Good 5 |
| Example 13 | $Na_2CO_3$; 2 $NaHCO_3$; 1 | Dipping method 34, 100 | Dry 40° C., 5 minutes | Dip-rinsing 24, 60 | Good 2 |
| Example 14 | $Na_2CO_3$; 2 $NaHCO_3$; 1 | Dipping method 34, 100 | Toluene —, 5 | Dip-rinsing 20, 60 | Good 0 |
| Example 15 | $Na_2CO_3$; 2 $NaHCO_3$; 1 | Dipping method 34, 100 | Cyclohexan —, 5 | Dip-rinsing 20, 60 | Good 0 | rinsing by means of dipping method with deionized water. In any of Examples 10 to 12, good patterns free from decrease in film thickness could be obtained.

EXAMPLE 13

This Example illustrates the seventh invention, wherein the curing of patterns is carried out in the manner that, after the developing in the first or fifth invention, the developed patterns are dried and then rinsed with water. Degree of the

EXAMPLES 16 TO 17

These Examples illustrate the ninth invention. The content of salts of alkali metals used in the ninth invention is desirably 0.01 to 10% by weight, more desirably 0.3 to 2% by weight, and that of other metals than alkali metals is desirably 0.005 to 10% by weight, more desirably 0.05 to 2% by weight. In case of the concentration below the above range, there is a tendency that a sufficient dissolution inhibition effect cannot be obtained and the patterns dissolve during the rinsing with water. Also in case the concentration is higher than the above range, there is a tendency that the salts remain after the rinsing with water, which is undesirable. Usable alkali metals are Na, K and Li. Non-restricted desirable metals other than alkali metals are Mg, Ca, Fe, Cu, Zn, Al, Si and Mg. In addition to them, Ag, Cr, Sn, V, or the like is usable, but are disadvantageous from cost and toxicity points of view.

As concretely shown in Table 7, experiments were carried out by rinsing with an aqueous magnesium sulfate solution and aqueous sodium chloride solution. The results are shown in Table 7 and indicate that good patterns free from decrease in film thickness could be obtained as compared to the case of rinsing with deionized water in Comparative Example 8.

EXAMPLES 18 AND COMPARATIVE EXAMPLE 8

This Example illustrates the tenth invention. Acids used in aqueous solutions for the rinsing are acetic acid, hydrochloric acid, or the like having a boiling point of not more than 200° C. Such acids have an advantage that they do not remain on substrates after drying. For example, other acids such as sulfuric acid, boric acid, phosphoric acid, silicic acid and various organic acids are also usable.

As concretely shown in Table 7, experiments were carried out by rinsing with hydrochloric acids. In Example 18, a good pattern free from decrease in film thickness could be obtained as compared to the rinsing with deionized water in Comparative Example 8.

TABLE 7

|  | Developing solution (% by weight) | Developing conditions (°C., seconds) | Rinsing (% by weight) | Rinsing conditions (°C., seconds) | Form of pattern (Decrease in coated film thickness %) |
| --- | --- | --- | --- | --- | --- |
| Example 16 | $Na_2CO_3$; 2<br>$NaHCO_3$; 1 | Dipping method<br>34, 150 | $MgSO_4$; 0.1 | Dip-rinsing<br>24, 60 | Good<br>0 |
| Example 17 | $Na_2CO_3$; 2<br>$NaHCO_3$; 1 | Dipping method<br>34, 150 | NaCl; 0.5 | Dip-rinsing<br>20, 60 | Good<br>0 |
| Example 18 | $Na_2CO_3$; 2<br>$NaHCO_3$; 1 | Dipping method<br>30, 150 | Aqueous HCl solution pH 2.0 | Dip-rinsing<br>20, 60 | Good<br>0 |
| Comparative Example 8 | $Na_2CO_3$; 2<br>$NaHCO_3$; 1 | Dipping method<br>34, 150 | De-ionized water | Dip-rinsing<br>24, 60 | Large decrease<br>30 |

EXAMPLE 19

This Example illustrates the eleventh invention. The oxidizing agents used in the eleventh invention are hydrogen peroxides, chlorines, bromines, hypochlorites, peroxosulfate and peroxophosphate.

In Example 19, the rinsing was carried out by using aqueous solutions containing 5% by weight of sodium peroxydisulfate, after the developing under the same conditions as Examples 16 to 18. In this case, since the rinsing solution itself indicates acidity, no addition of acids is necessary. As a result, the same pattern as Examples 16 to 18 could be obtained. In addition, there could be improved the evenness in thickness at the edge portion of patterns, and an amount of foreign matters among patterns and remaining undissolved film were decreased.

What we claim is:

1. A process for forming patterns in an active beam sensitive resin film, which comprises the steps of:
   a) forming a film of an active beam sensitive resin on a substrate;
   b) thereafter exposing selected areas of the film to an active beam;
   c) thereafter bringing the film into contact with a solution consisting essentially of an aqueous solution which contains at least 3.0% by weight of an alkali metal salt or 0.1 to 20% by weight of a soluble metal salt other than an alkali metal salt, wherein said alkali metal or non-alkali metal salt is selected from the group consisting of sodium chloride, potassium chloride, calcium chloride, and magnesium sulfate, and wherein said alkali metal or non-alkali metal salt solution inhibits the dissolution of the active beam sensitive resin film when this film is exposed in a later step to a basic aqueous developing solution and which solution thereby inhibits a decrease in the thickness of the areas of the film which have been selectively exposed to an active beam, which areas form a pattern, during subsequent development of the film with a basic aqueous developing solution; and
   d) thereafter developing the film with said basic aqueous developing solution.

2. The process of claim 1, which comprises, after the developing step, a step of bringing the film into contact with a solution having a higher ionic strength than the developing solution.

3. The process of claim 1, which comprises, after the developing step, a step of drying the film and thereafter a step of washing the film with water.

4. The process of claim 1, which comprises, after the developing step, a step of impregnating the patterned film with a non-polar solvent.

5. The process of claim 1, which comprises, after the developing step, a step of washing the film with an aqueous solution containing an ion prepared by dissolving a salt.

6. The process of claim 1, which comprises, after the developing step, a step of washing the film with an acidic aqueous solution containing an acid having a boiling point of not more than 200° C.

7. The process of claim 1, which comprises, after the developing step, a step of washing the film with an acidic aqueous solution wherein said acidic aqueous solution contains an acid selected from the group consisting of acetic acid, hydrochloric acid, sulfuric acid, boric acid, phosphoric acid and silicic acid.

8. The process of claim 1, which comprises, after the developing step, a step of washing the film with an aqueous solution prepared by adding an oxidizing agent to an acidic aqueous solution containing an acid having a boiling point of not more than 200° C.

9. The process of claim 8, which comprises, after the developing step, a step of washing the film with an aqueous solution prepared by adding an oxidizing agent to an acidic aqueous solution wherein said acidic aqueous solution contains an acid selected from the group consisting of acetic acid, hydrochloric acid, sulfuric acid, boric acid, phosphoric acid, and silicic acid.

10. The process of claim 1, wherein the solution of c) consisting essentially of an aqueous solution containing an alkali metal salt or a non-alkali metal salt contains at least 5.0% by weight of an alkali metal salt or 1.0 to 10% by weight of a metal salt other than an alkali metal salt.

* * * * *